(12) United States Patent
Steckner et al.

(10) Patent No.: US 9,921,277 B2
(45) Date of Patent: Mar. 20, 2018

(54) PORTABLE DEVICE FOR EMERGENCY MAGNETIC FIELD SHUTDOWN

(71) Applicant: Toshiba Medical Systems Corporation, Tochigi (JP)

(72) Inventors: Michael Steckner, Beachwood, OH (US); Edwin Gonzalez, Laurence Harbor, NJ (US); Joseph Prudic, Medina, OH (US); Dale Allan Messner, Uniontown, OH (US)

(73) Assignee: Toshiba Medical Systems Corporation, Otawara-shi (JP)

( * ) Notice: Subject to any disclaimer, the term of this patent is extended or adjusted under 35 U.S.C. 154(b) by 2 days.

(21) Appl. No.: 15/072,205

(22) Filed: Mar. 16, 2016

(65) Prior Publication Data

US 2017/0269175 A1 Sep. 21, 2017

(51) Int. Cl.
  *G08B 1/00* (2006.01)
  *G01R 33/28* (2006.01)
  *G08B 21/02* (2006.01)
  *G08B 5/22* (2006.01)

(52) U.S. Cl.
  CPC ......... *G01R 33/288* (2013.01); *G01R 33/283* (2013.01); *G08B 5/22* (2013.01); *G08B 21/02* (2013.01)

(58) Field of Classification Search
  CPC .................................................. G01R 33/288
  USPC .................. 340/532, 506, 539.1, 539.11, 3.1
  See application file for complete search history.

(56) References Cited

U.S. PATENT DOCUMENTS

| | | | |
|---|---|---|---|
| 4,763,221 A | 8/1988 | Takechi | |
| 4,807,084 A | 2/1989 | Takechi | |
| 5,400,246 A * | 3/1995 | Wilson | G06F 3/023 340/12.53 |
| 5,959,529 A * | 9/1999 | Kail, IV | G01S 19/17 128/903 |
| 8,385,033 B2 | 2/2013 | Gebhardt et al. | |

* cited by examiner

*Primary Examiner* — Daryl Pope
(74) *Attorney, Agent, or Firm* — Oblon, McClelland, Maier & Neustadt, L.L.P.

(57) ABSTRACT

Devices and methods are provided for shutting down a magnet system. The device includes a portable housing, a communication unit, and a switch on the portable housing. The portable housing encloses a field shutdown initiation circuitry. The communication unit is disposed at least partially in the portable housing and the communication unit is configured to establish communication between the field shutdown initiation circuitry and the magnet system. The switch is configured to turn on the field shutdown initiation circuitry to initiate a magnet field shutdown in the magnet system.

17 Claims, 7 Drawing Sheets

PORTABLE DEVICE FOR EMERGENCY MAGNETIC FIELD SHUTDOWN

TECHNICAL FIELD

The present disclosure generally relates to the technical field of medical devices, and more particularly, to methods and devices for shutting down a magnetic field in an emergency situation.

BACKGROUND

A magnetic resonance imaging (MRI) system may generate a relatively strong magnetic field in a magnet room including the MRI system. Existing MRI installations have fixed emergency shutdown button(s). When the need arises, the switch is closed and the magnet field rapidly decays. There have been instances where, because of natural disasters or fires, the wires connecting the switch to the magnet have been disabled.

Thus, there exists a need to be able to shut down the magnetic field during the emergency situations.

SUMMARY

In a first aspect of the present disclosure, there is provided a device for shutting down a magnetic field in a magnet system. The device includes a portable housing, a communication unit, and a switch on the portable housing. The portable housing encloses a field shutdown initiation circuitry. The communication unit is disposed at least partially in the portable housing and the communication unit is configured to establish communication between the field shutdown initiation circuitry and the magnet system. The switch is configured to turn on the field shutdown initiation circuitry to initiate a magnet field shutdown in the magnet system.

In a second aspect of the present disclosure, there is provided a device. The device includes a portable housing enclosing a field shutdown initiation circuitry inside the portable housing. The device includes a cable including a first end connected to the field shutdown initiation circuitry. A second end of the cable includes a universal interface configured to be connected to a plurality of magnet systems. The field shutdown initiation circuitry is configured to send a shutting down signal to a magnetic field in a magnet system when the cable is connected to the magnet system.

In a third aspect of the present disclosure, a device includes a housing enclosing a field shutdown initiation circuitry inside the housing, where the housing is configured to be attached to the magnet system. The device includes a communication circuitry disposed in the housing and electronically connected to the field shutdown initiation circuitry. The communication circuitry is configured to receive a wireless instruction from a remote device. The device includes a switch on the housing. The switch is configured to turn on the field shutdown initiation circuitry so that the field shutdown initiation circuitry sends a shutting down signal to the magnet system when the wireless instruction comprises an authentication code confirming an emergency.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments consistent with the invention and, together with the description, serve to explain the principles of the invention.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the invention. Instead, they are merely examples of apparatuses and methods consistent with aspects related to the invention as recited in the appended claims.

Reference throughout this specification to "one embodiment," "an embodiment," "exemplary embodiment," or the like in the singular or plural means that one or more particular features, structures, or characteristics described in connection with an embodiment is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

The terminology used in the description of the disclosure herein is for the purpose of describing particular examples only and is not intended to be limiting of the disclosure. As used in the description of the disclosure and the appended claims, the singular forms "a," "an," and "the" are intended to include the plural forms as well, unless the context clearly indicates otherwise. Also, as used in the description herein and throughout the claims that follow, the meaning of "in" includes "in" and "on" unless the context clearly dictates otherwise. It will also be understood that the term "and/or" as used herein refers to and encompasses any and all possible combinations of one or more of the associated listed items. It will be further understood that the terms "may include," "including," "comprises," and/or "comprising," when used in this specification, specify the presence of stated features, operations, elements, and/or components, but do not preclude the presence or addition of one or more other features, operations, elements, components, and/or groups thereof.

It should be understood, although elements may be described as terms first, second, third or the like in the present disclosure, the elements are not limited by these terms. Rather, these terms are merely used for distinguishing elements of the same type. For example, a first element can also be referred to as a second element, and similarly, a second element can also be referred to as a first element, without departing from the scope of the present disclosure. Depending on the context, as used herein, the word "if" can be interpreted as "at the time when", "when" or "in response to."

Figure 1:
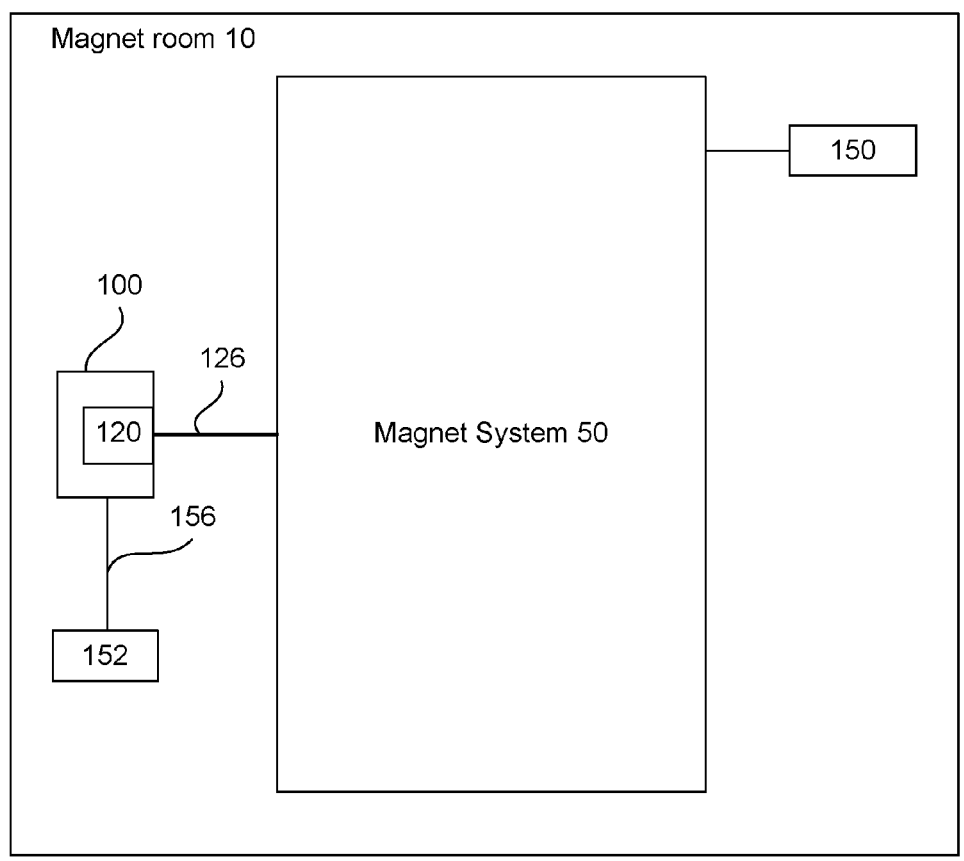
FIG. 1 is a block diagram according to embodiments of the present disclosure.

FIG. 1 is a block diagram according to embodiments of the present disclosure. In a magnet room 10, a magnet system 50 may include a resistive magnet or a superconducting magnet. The resistive magnet may have lower field strength than the superconducting magnet generally. The magnet room 10 may be constructed using barriers made of conductive or magnetic materials which provide protection against external field disturbances. The magnet room 10 may adopt active and passive magnetic shielding methods to reduce fringe fields and thus protects the main magnetic field from certain outside influences, such as the presence of stationary ferromagnetic material or slowly moving stray fields outside the magnet room. Further, the magnet room 10 may adopt radio frequency (RF) shielding methods to reduce disturbances from high frequency electromagnetic fields outside the scanner.

The magnet system 50 may include a substantially coaxial cylindrical arrangement of the static field magnet, a plurality of gradient coils and an RF coil assembly. Along the horizontal axis of this cylindrical array of elements is an imaging volume which is configured to substantially encompass a patient supported by a patient bed or table.

A device 100 is provided during emergency situations to provide a shutdown signal to the magnet system 50. The device 100 may include a communication unit 120 that is configured to send the shutdown signal to the magnet system 50 via a cable 126.

The magnet room 10 may include sensors 150 and 152, which may be configured to monitor the magnet room 10 and the magnet system 50. For example, the sensors 150 and 152 may include temperature sensors, oxygen sensors, smoke detectors, humidity sensors, etc. The sensor 150 may include one or more magnet sensors configured to be directly connected with the magnet system 50. The device 100 may read data from the sensor 150 via the cable 126 or other communication channels. The sensor 152 may include ambient room sensors, which are configured to monitor environment data of the magnet room 10. The device 100 may read data directly from the sensor 152 via a second cable 156 or other communication channels.

Figure 2:
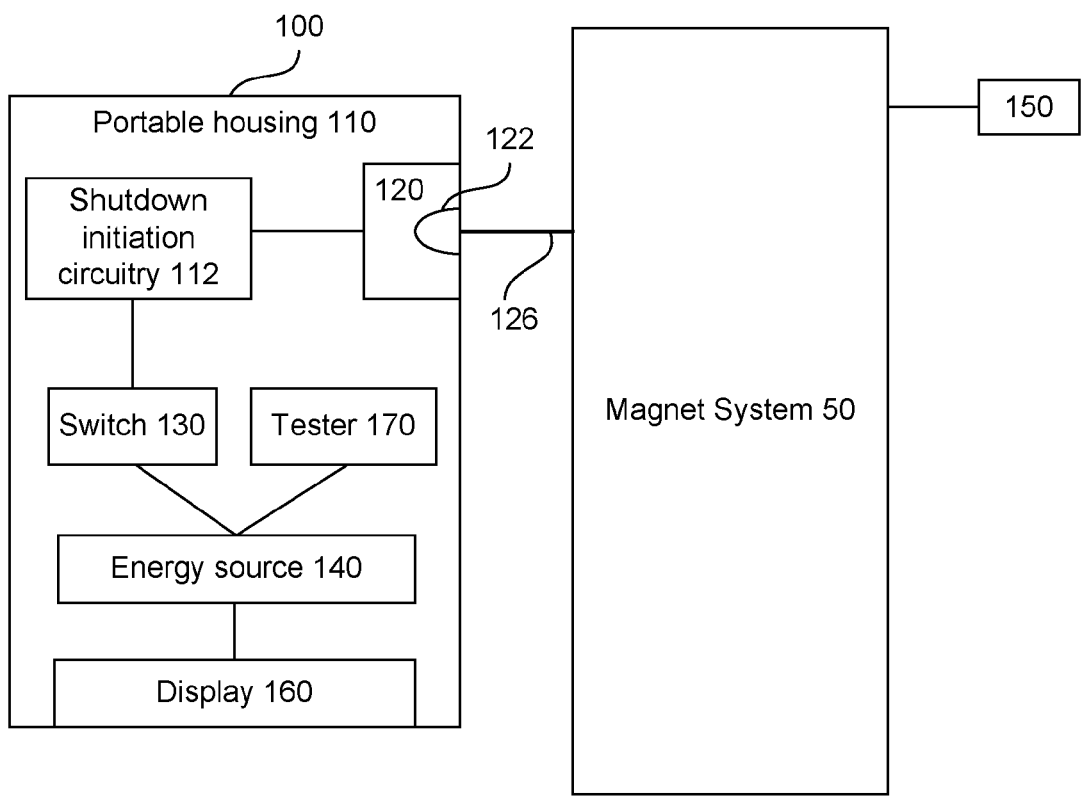
FIG. 2 is a block diagram according to embodiments of the present disclosure.

FIG. 2 is a block diagram according to embodiments of the present disclosure. FIG. 2 shows a detailed structure of the device 100. The device 100 may shut down a magnetic field in a magnet system 50. The device 100 includes a portable housing 110 enclosing a field shutdown initial circuitry 112. The portable housing 110 may be carried by a field engineer during emergency situations. The portable housing 110 may be made of plastic or other non-ferromagnetic materials. The portable housing 110 may have a dimension similar to a small brief case or smaller.

The device 100 also includes a communication unit 120 disposed at least partially in the portable housing 110. The communication unit 120 is configured to establish communication between the field shutdown initiation circuitry 112 and the magnet system 50. The communication unit 120 may include a universal plug connector 122 on the portable housing 110. The universal plug connector 122 is configured to connect with different magnet systems from different manufacturers and establish a communication channel between the field shutdown initiation circuitry and each of the different magnet systems. For example, different magnet systems in lots of hospitals may be affected during an emergency situation. A single device may be used to work with the different magnet systems when the device includes the universal plug connector 122. The universal plug connector 122 may include a plurality of plug interfaces to accommodate the different magnet systems.

The device 100 may include a switch 130 on the portable housing 110, where the switch 130 is configured to turn on the field shutdown initiation circuitry 112 to initiate a magnet field shutdown in the magnet system 50. For example, the switch 130 is configured to turn on the field shutdown initiation circuitry 112 so that the field shutdown initiation circuitry 112 sends a shutting down signal to the magnet system 50 via a cable 126 connected between the communication unit 120 and the magnet system 50.

Figure 3:
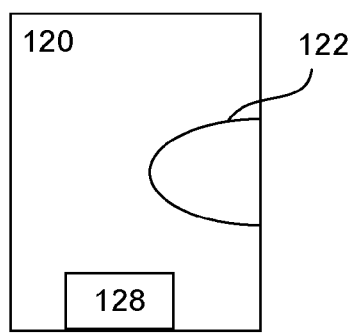
FIG. 3 is a block diagram according to embodiments of the present disclosure.

As shown in FIG. 3, the communication unit 120 may include a wireless connector 128. The wireless connector 128 may establish a second communication channel between the communication unit 120 and the magnet system 50.

As shown in FIG. 2 or in FIG. 1, the sensor 150 and 152 may monitor the magnet room accommodating the magnet system 50. The device 100 may use the cable 126 to connect to the magnet system and thus obtain environment information from one or more sensors 150 and 152. The device 100 may also obtain the environment information via the wireless connector 128 shown in FIG. 3.

The device 100 may include a display 160 to display the environment information of the magnet room. Alternatively or additionally, the device 100 may send the environmental information to a smart terminal including a display so that the smart terminal displays the environmental information. The smart terminal may include a smart phone, a laptop, a tablet, etc.

The device 100 may further include an energy source 140 and a built-in energy source tester 170. The energy source 140 includes at least one of the following: a rechargeable battery of small capacity; a capacitor bank with a hand crank dynamo; a special battery that is dormant until activated; and a receiver that connects with a separate power source. The built-in energy source tester 170 may test the energy level of the energy source 140 and then display the energy level on the display 160 periodically. The energy level may be displayed with a unit indicating how many magnet systems may be shut down with the energy source 140 in a preset period of time. For example, the display 160 may display "The device with serial number XYZ1234 is capable of shutting down at least 5 MR scanners in the next 24 hours without a charge." Note that a single shutdown may require a very small amount of power: a few joules.

Figure 4:
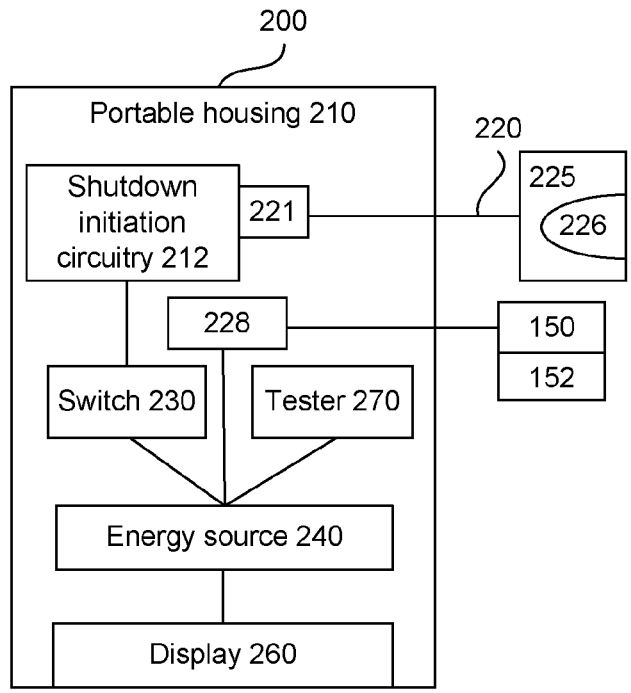
FIG. 4 is a block diagram according to embodiments of the present disclosure.

FIG. 4 is a block diagram according to embodiments of the present disclosure. FIG. 4 illustrates the device 200 for shutting down a magnetic field in a magnet system. The device 200 includes a portable housing 210 enclosing a field shutdown initiation circuitry 212 inside the portable housing 210.

One of the different structures between the device 200 and the device 100 is that the device 200 includes a cable 220 as a part of the portable device 200. The cable 220 includes a first end 221 connected to the field shutdown initiation circuitry 212 and a second end 225 including a universal interface 226 configured to be connected to a plurality of magnet systems. The cable 220 may include plastic shield and non-ferromagnetic conductive materials surrounded by the plastic shield. The universal interface 226 may include a plurality of sockets or plugs for different magnet systems. Alternatively or additionally, the universal interface 226 may further include a standard socket which may be connected to a plurality of special adapters connected to the different magnet systems.

In the device 200, the field shutdown initiation circuitry 212 is configured to send a shutting down signal to a magnetic field in a magnet system when the cable 220 is connected to the magnet system. For example, during emergency situations, the field engineer may preset the device 200 in an emergency mode by inputting the model number of the MR scanner and confirming its address and other authentication information so that the device 200 is ready to send out the shutting down signal when the cable is connected to the MR scanner.

Similar to the device 100 in FIG. 1, the device 200 also includes an energy source 240 in the portable housing 210, where the energy source 240 is configured to provide power to the field shutdown initiation circuitry 212.

The device 200 includes a switch 230 on the portable housing 210, where the switch 230 is configured to control the field shutdown initiation circuitry 212. The switch may be connected between the energy source 240 and the field shutdown initiation circuitry 212. For example, the switch 230 is configured to turn on the field shutdown initiation circuitry 212 so that the field shutdown initiation circuitry 212 sends a shutting down signal to the magnet system via the cable or other communication channels.

The device 200 may further include a wireless connector 228, which is configured to establish a wireless communication channel between the device 200 and one or more sensors 150 and 152 that monitor a magnet room accommodating the magnet system. The device 200 then may obtain environmental information from one or more sensors 150 and 152 using the wireless communication channel or the cable. The device 200 may display the obtained information on a display 260 or other connected smart terminal including a display.

Figure 5:
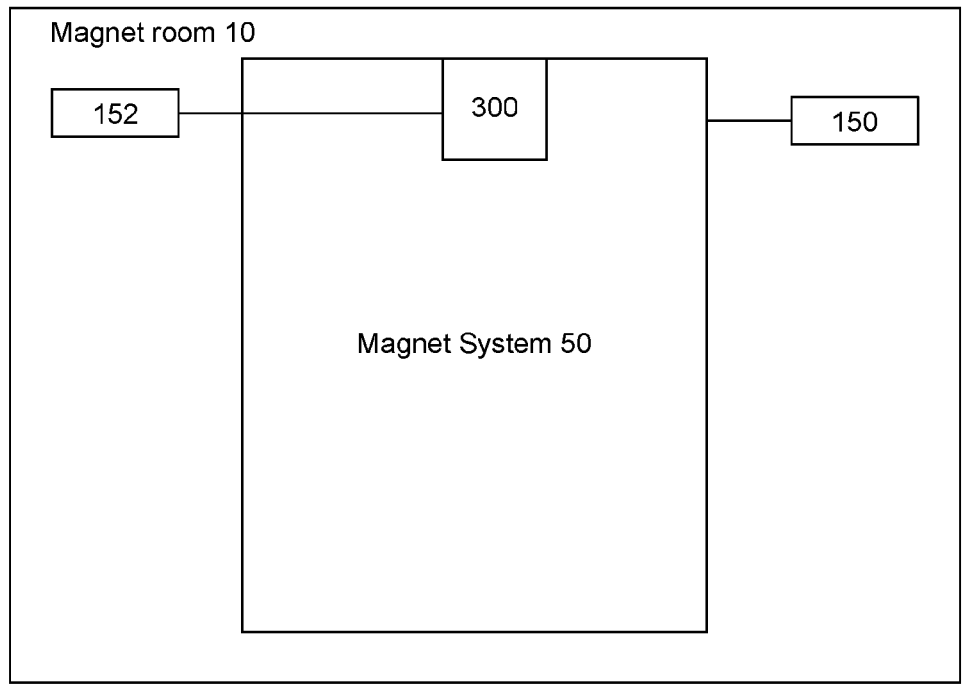
FIG. 5 is a block diagram according to embodiments of the present disclosure.

FIG. 5 is a block diagram according to embodiments of the present disclosure. In FIG. 5, the device 300 is attached to the magnet system 50 in the magnet room 10. For example, when there is a weather forecast about a hurricane in certain area, field engineers may attach the device 300 the MR scanners in the area. The field engineers may then remotely monitor the conditions in the magnet room using the environment information from the one or more sensors 150 and 152. If the environment information confirms that the magnet system 50 needs to be shut down, the field engineer may remotely shut down the magnet system using the device 300.

Figure 6:
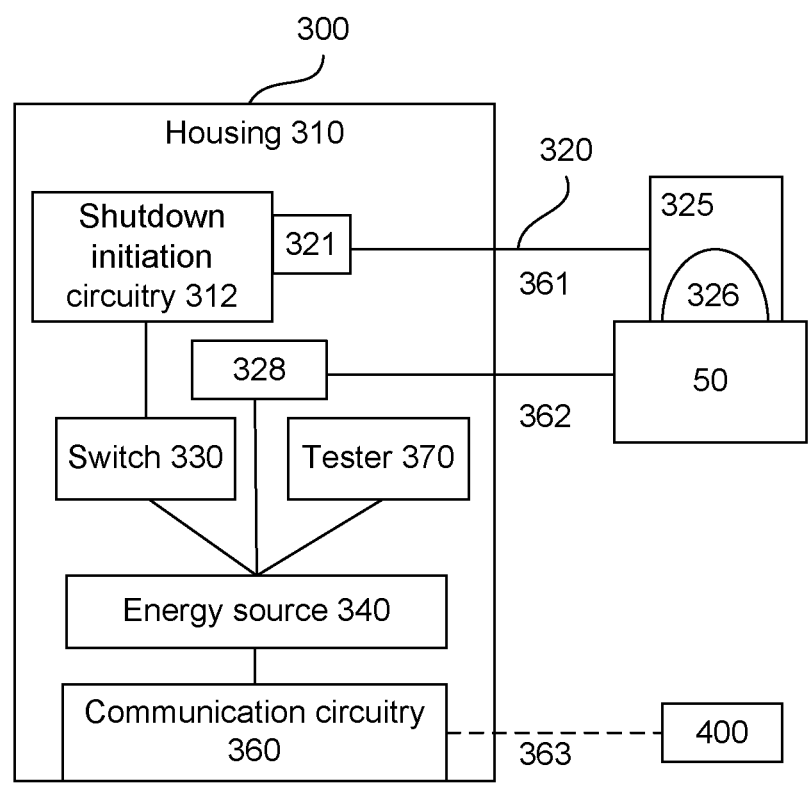
FIG. 6 is a block diagram according to embodiments of the present disclosure.

FIG. 6 is a block diagram of the device 300 shown in FIG. 5. The device 300 includes a housing 310 enclosing a field shutdown initiation circuitry 312 inside the housing 310. The housing 310 is configured to be attached to the magnet system 50. To work properly in hazardous situations, the housing 310 may include special material or structure so that the housing 310 cannot be detached from the device 300 by a hurricane or a small earthquake without human intervention.

The device 300 may further include a communication circuitry 360 disposed in the housing and electronically connected to the field shutdown initiation circuitry 312. The communication circuitry 360 is configured to receive a wireless instruction from a remote device 400. For example, the communication circuitry 360 may receive the wireless instruction through a secured wireless communication channel 363.

The device may include a switch 330 on the housing 310, where the switch 330 is configured to turn on the field shutdown initiation circuitry 312 so that the field shutdown initiation circuitry 312 sends a shutting down signal to the magnet system when the wireless instruction includes an authentication code confirming an emergency. The authentication code may be preset by manufacturers or field engineers. For example, the authentication code may include a serial number of the MR scanner and other identification of the magnet system. The authentication code may be encrypted using one or more predetermined encryption keys.

The device 300 may include a cable 320 including a first end 321 connected to the field shutdown initiation circuitry 312 and a second end 325 configured to be connected to an adapter in the magnet system. The cable 320 establishes a first communication channel 361 between the field shutdown initiation circuitry 312 and the magnet system 50.

The communication circuitry 360 is configured to activate a wireless connector 328 to establish a second communication channel 362 between the field shutdown initiation circuitry and the magnet system 50.

The device 300 may include a built-in energy source tester 370 and an energy source 340. The energy source 340 may include at least one of the following: a rechargeable battery of small capacity; a capacitor bank with a hand crank dynamo; a special battery that is dormant until activated, and a receiver that connects with a separate power source.

Figure 7:
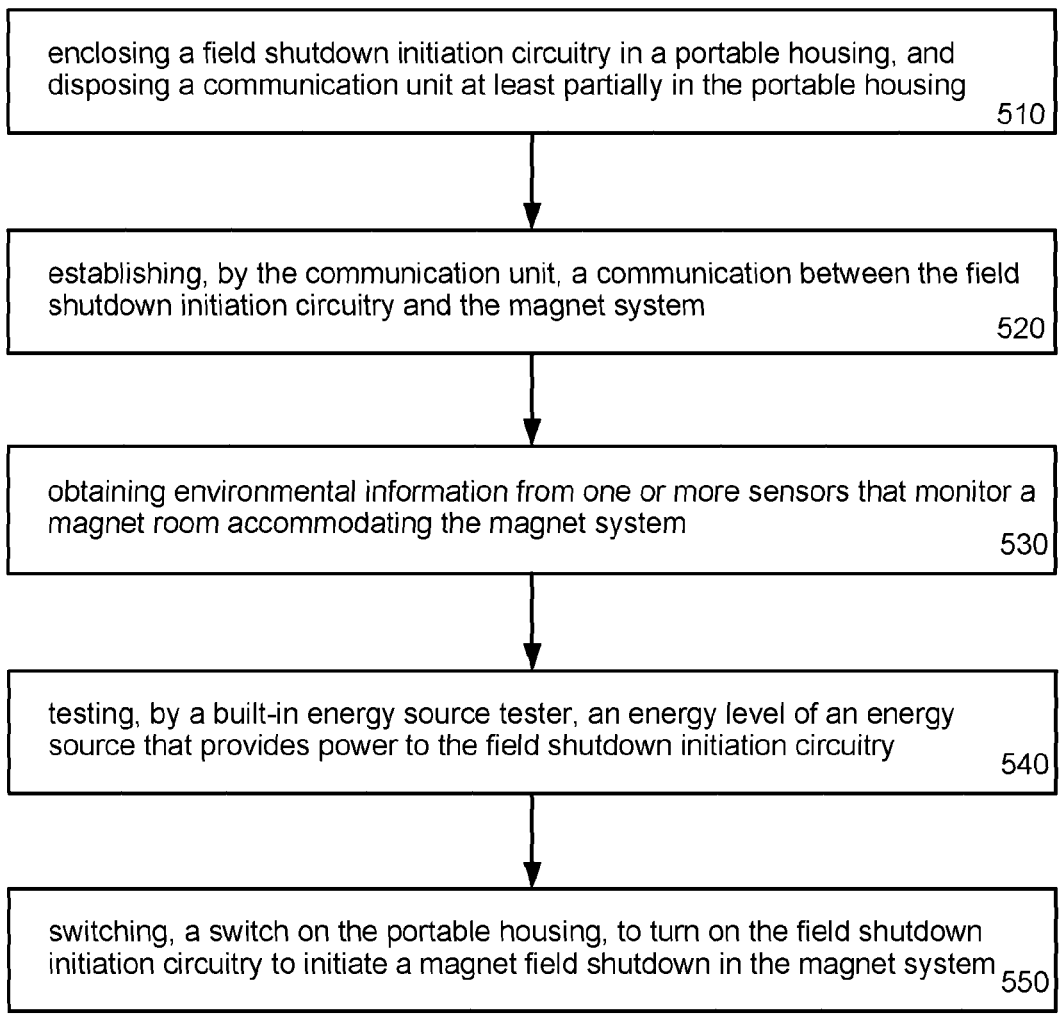
FIG. 7 is a flow chart of a method according to an exemplary embodiment of the present disclosure.

FIG. 7 is a flow chart of a method according to an exemplary embodiment of the present disclosure. In the method, the device 100 shown in FIGS. 1-2 may be used by a field engineer to shut down a magnet system during emergency situations. It should be noted that not all acts are required in each instance. Additional acts may be added and one or more of the acts in the flow chart may be omitted or substituted. Further, the acts do not need to be performed in the specific order as illustrated.

For example, in act 510, a field shutdown initiation circuitry is enclosed in a portable housing. A communication unit is disposed at least partially in the portable housing. The act 510 may be performed by workers, engineers, or robots in an assembling line.

In act 520, the communication unit establishes a communication between the field shutdown initiation circuitry and the magnet system. A field engineer may test the communication unit during installation of the magnet system.

In act 530, the device obtains environmental information from one or more sensors that monitor a magnet room accommodating the magnet system. The device may obtain the environmental information when it is turned on.

In act 540, a built-in energy source tester may test an energy level of an energy source that provides power to the field shutdown initiation circuitry. The built-in energy source tester may automatically test the energy level periodically with a preset time period.

In act 550, a switch on the portable housing may switch the portable device on to turn on the field shutdown initiation circuitry to initiate a magnet field shutdown in the magnet system.

Figure 8:
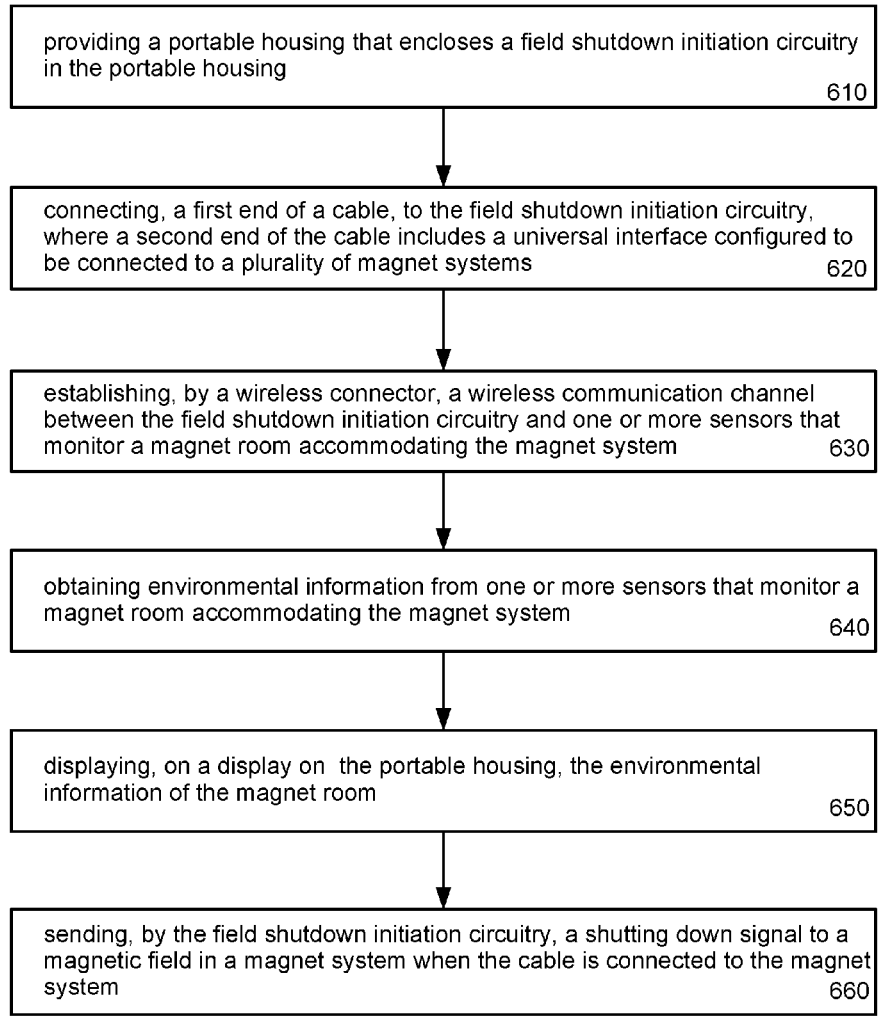
FIG. 8 is a flow chart of a method according to an exemplary embodiment of the present disclosure.

FIG. 8 is a flow chart of a method according to an exemplary embodiment of the present disclosure. In the method, the device 200 shown in FIG. 4 may be used by a field engineer to shut down a magnet system during emergency situations. It should be noted that not all acts are required in each instance. Additional acts may be added and one or more of the acts in the flow chart may be omitted or substituted. Further, the acts do not need to be performed in the specific order as illustrated. For example, in act 610, a portable housing is provided. The portable housing encloses a field shutdown initiation circuitry in the portable housing.

In act 620, a first end of a cable is connected to the field shutdown initiation circuitry. A second end of the cable includes a universal interface configured to be connected to a plurality of magnet systems. The act may be performed by a field engineer or a robot remotely controlled by a field engineer.

In act 630, a wireless connector may establish a wireless communication channel between the field shutdown initiation circuitry and one or more sensors that monitor a magnet room accommodating the magnet system. The act 630 may be omitted when it is safe to use a cable to directly connect the filed shutdown initiation circuitry and the magnet system as in act 620. The act 630 may also be performed before the act 620 is performed in order to determine whether it is safe to enter the magnet room.

In act 640, the device 200 may obtain environmental information from one or more sensors that monitor a magnet room accommodating the magnet system. The device 200 may use the cable in act 620 or the wireless communication channel in act 630 to obtain the environmental information.

In act 650, the device 200 may display, on a display on the portable housing, the environmental information of the magnet room. When the device first obtains environmental information via the wireless communication channel, the act 650 may be performed before the act 620 in some cases.

In act 660, the field shutdown initiation circuitry sends a shutting down signal to a magnetic field in a magnet system when the cable is connected to the magnet system.

Figure 9:
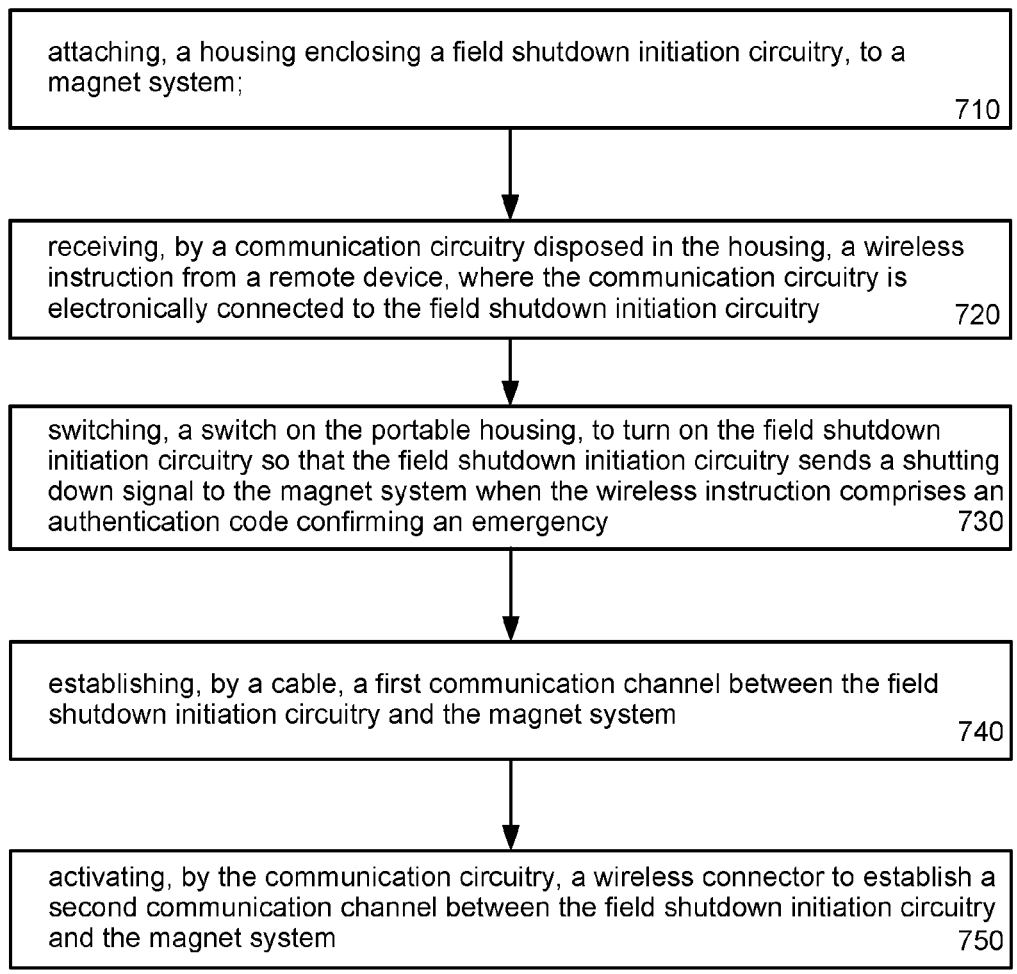
FIG. 9 is a flow chart of a method according to an exemplary embodiment of the present disclosure.

FIG. 9 is a flow chart of a method according to an exemplary embodiment of the present disclosure. In the method, the device 300 shown in FIGS. 5-6 may be used by a field engineer to shut down a magnet system during emergency situations. Additional acts may be added and one or more of the acts in the flow chart may be omitted or substituted. Further, the acts do not need to be performed in the specific order as illustrated. For example, in act 710, a housing structure may be attached to a magnet system, where the housing encloses a field shutdown initiation circuitry.

In act 720, a communication circuitry receives a wireless instruction from a remote device, where the communication circuitry is electronically connected to the field shutdown initiation circuitry. Here, the communication circuitry may be disposed in the housing of the device 300.

In act 730, the device 300 switches, by a switch disposed on the portable housing, to turn on the field shutdown initiation circuitry so that the field shutdown initiation circuitry sends a shutting down signal to the magnet system when the wireless instruction comprises an authentication code confirming an emergency.

In act 740, the device 300 establishes, by a cable, a first communication channel between the field shutdown initiation circuitry and the magnet system. The act 740 may be performed before the act 720 and after the act 710.

In act 750, the device 300 activates, by the communication circuitry, a wireless connector to establish a second communication channel between the field shutdown initiation circuitry and the magnet system. When the cable in act 740 is not working properly, the act 750 may be performed to establish the second communication channel.

The disclosure provides a portable device that may quickly connect to a quench heater or other component on the magnet system and provide the necessary signal to initiate a field shutdown. With an independent and portable kit, the operator may attach a portable switch and initiate the shutdown process. This device includes a plug that fits into the proper port of the magnet. The device may include a universal plug configuration, which may be attached to a long cable.

For superconducting magnets, as the quench process rapidly expands the helium liquid to gas, the explosive forces can be significant. With a long cable the operator initiating the quench may be removed from the magnet to a safe location. The other end of the cable may be attached to a battery and switch box. Once the operator is ready, the switch may be momentarily closed and cause the quench process to initiate.

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A device for shutting down a magnetic field in a magnet system, comprising:
    a portable housing enclosing field shutdown initiation circuitry;
    a communication unit disposed at least partially in the portable housing, the communication unit configured to establish communication between the field shutdown initiation circuitry and the magnet system;
    a switch on the portable housing, the switch configured to turn on the field shutdown initiation circuitry to initiate a magnet field shutdown in the magnet system; and
    an energy source in the portable housing, the energy source configured to provide power to the field shutdown initiation circuitry.

2. A device for shutting down a magnetic field in a magnet system, comprising:
    a portable housing enclosing field shutdown initiation circuitry;
    a communication unit disposed at least partially in the portable housing, the communication unit configured to establish communication between the field shutdown initiation circuitry and the magnet system; and
    a switch on the portable housing, the switch configured to turn on the field shutdown initiation circuitry to initiate a magnet field shutdown in the magnet system,
    wherein the communication unit comprises a universal plug connector on the portable housing, the universal plug connector configured to connect with different magnet systems from different manufacturers and establish a communication channel between the field shutdown initiation circuitry and the magnet system.

3. A device for shutting down a magnetic field in a magnet system, comprising:

a portable housing enclosing field shutdown initiation circuitry;

a communication unit disposed at least partially in the portable housing, the communication unit configured to establish communication between the field shutdown initiation circuitry and the magnet system; and a switch on the portable housing, the switch configured to turn on the field shutdown initiation circuitry to initiate a magnet field shutdown in the magnet system, wherein the switch is configured to turn on the field shutdown initiation circuitry so that the field shutdown initiation circuitry sends a shutting down signal to the magnet system via a cable connected between the communication unit and the magnet system.

4. A device for shutting down a magnetic field in a magnet system, comprising:

a portable housing enclosing field shutdown initiation circuitry;

a communication unit disposed at least partially in the portable housing, the communication unit configured to establish communication between the field shutdown initiation circuitry and the magnet system; and a switch on the portable housing, the switch configured to turn on the field shutdown initiation circuitry to initiate a magnet field shutdown in the magnet system, wherein the communication unit comprises a wireless connector, and the wireless connector establishes a second communication channel between the communication unit and the magnet system.

5. The device of claim 4, further configured to obtain environmental information from one or more sensors that monitor a magnet room accommodating the magnet system.

6. The device of claim 5, further comprising a display to display the environmental information of the magnet room.

7. A device for shutting down a magnetic field in a magnet system, comprising:

a portable housing enclosing field shutdown initiation circuitry;

a communication unit disposed at least partially in the portable housing, the communication unit configured to establish communication between the field shutdown initiation circuitry and the magnet system;

a switch on the portable housing, the switch configured to turn on the field shutdown initiation circuitry to initiate a magnet field shutdown in the magnet system; and a built-in energy source tester and at least one of the following:

a rechargeable battery of small capacity;

a capacitor bank with a hand crank dynamo;

a special battery that is dormant until activated; and a receiver that connects with a separate power source.

8. A device, comprising:

a portable housing enclosing a field shutdown initiation circuitry inside the portable housing;

a cable comprising a first end connected to the field shutdown initiation circuitry and a second end including a universal interface configured to be connected to a plurality of magnet systems; and an energy source in the portable housing, the energy source configured to provide power to the field shutdown initiation circuitry, wherein the field shutdown initiation circuitry is configured to send a shutting down signal to a magnetic field in a magnet system when the cable is connected to the magnet system.

9. A device, comprising:

a portable housing enclosing a field shutdown initiation circuitry inside the portable housing;

a cable comprising a first end connected to the field shutdown initiation circuitry and a second end including a universal interface configured to be connected to a plurality of magnet systems; and a switch on the portable housing, the switch configured to control the field shutdown initiation circuitry, wherein the field shutdown initiation circuitry is configured to send a shutting down signal to a magnetic field in a magnet system when the cable is connected to the magnet system.

10. The device of claim 9, wherein the switch is configured to turn on the field shutdown initiation circuitry so that the field shutdown initiation circuitry sends a shutting down signal to the magnet system via the cable.

11. A device, comprising:

a portable housing enclosing a field shutdown initiation circuitry inside the portable housing;

a cable comprising a first end connected to the field shutdown initiation circuitry and a second end including a universal interface configured to be connected to a plurality of magnet systems; and a wireless connector, the wireless connector establishes a wireless communication channel between the device and one or more sensors that monitor a magnet room accommodating the magnet system, wherein the field shutdown initiation circuitry is configured to send a shutting down signal to a magnetic field in a magnet system when the cable is connected to the magnet system.

12. A device, comprising:

a portable housing enclosing a field shutdown initiation circuitry inside the portable housing; and a cable comprising a first end connected to the field shutdown initiation circuitry and a second end including a universal interface configured to be connected to a plurality of magnet systems, wherein the field shutdown initiation circuitry is configured to send a shutting down signal to a magnetic field in a magnet system when the cable is connected to the magnet system, and wherein the device is further configured to obtain environmental information from one or more sensors that monitor a magnet room accommodating the magnet system.

13. The device of claim 12, further comprising a display to display the environmental information of the magnet room.

14. A device, comprising:

a portable housing enclosing a field shutdown initiation circuitry inside the portable housing;

a cable comprising a first end connected to the field shutdown initiation circuitry and a second end including a universal interface configured to be connected to a plurality of magnet systems; and a built-in energy source tester and at least one of the following:

a rechargeable battery of small capacity;

a capacitor bank with a hand crank dynamo;

a special battery that is dormant until activated; and a receiver that connects with a separate power source, wherein the field shutdown initiation circuitry is configured to send a shutting down signal to a magnetic field in a magnet system when the cable is connected to the magnet system.

15. A device for shutting down a magnetic field in a magnet system, comprising:
- a housing enclosing a field shutdown initiation circuitry inside the housing, the housing configured to be attached to the magnet system;
- a communication circuitry disposed in the housing and electronically connected to the field shutdown initiation circuitry, the communication circuitry configured to receive a wireless instruction from a remote device,
- a switch on the housing, the switch configured to turn on the field shutdown initiation circuitry so that the field shutdown initiation circuitry sends a shutting down signal to the magnet system when the wireless instruction comprises an authentication code confirming an emergency; and
- a cable comprising a first end connected to the field shutdown initiation circuitry and a second end configured to be connected to an adapter in the magnet system, wherein the cable establishes a first communication channel between the field shutdown initiation circuitry and the magnet system.

16. The device of claim 15, wherein the communication circuitry is configured to activate a wireless connector to establish a second communication channel between the field shutdown initiation circuitry and the magnet system.

17. The device of claim 16, further comprising a built-in energy source tester and at least one of the following:
- a rechargeable battery of small capacity;
- a capacitor bank with a hand crank dynamo;
- a special battery that is dormant until activated; and
- a receiver that connects with a separate power source.

* * * * *